United States Patent
Shimoyama et al.

[11] Patent Number: 6,023,483
[45] Date of Patent: Feb. 8, 2000

[54] SEMICONDUCTOR LIGHT-EMITTING DEVICE

[75] Inventors: Kenji Shimoyama; Katsushi Fujii; Satoru Nagao; Hideki Goto, all of Ibaraki, Japan

[73] Assignee: Mitsubishi Chemical Corporation, Tokyo, Japan

[21] Appl. No.: 09/048,183

[22] Filed: Mar. 26, 1998

[30] Foreign Application Priority Data

| Mar. 26, 1997 | [JP] | Japan | 9-072933 |
| Mar. 26, 1997 | [JP] | Japan | 9-072934 |
| Mar. 26, 1997 | [JP] | Japan | 9-072935 |
| Mar. 26, 1997 | [JP] | Japan | 9-074264 |

[51] Int. Cl.⁷ .................................................. H01S 3/19
[52] U.S. Cl. ................................................... 372/45
[58] Field of Search ............................. 372/45, 46

[56] References Cited

U.S. PATENT DOCUMENTS

| 5,376,581 | 12/1994 | Shimoyama et al. . | |
| 5,477,063 | 12/1995 | Shakuda | 372/45 |
| 5,586,136 | 12/1996 | Honda et al. | 372/45 |
| 5,663,976 | 9/1997 | Razeghi | 372/45 |
| 5,844,931 | 12/1998 | Sagawa et al. | 372/45 |

FOREIGN PATENT DOCUMENTS

| 0 548 368 A1 | 1/1993 | European Pat. Off. . |
| 5-121822 | 5/1993 | Japan . |
| 9-199791 | 7/1997 | Japan . |

OTHER PUBLICATIONS

Electronics Letters, Jul. 30, 1992, vol. 28, No. 16, pp. 1531–1532.

*Primary Examiner*—Rodney Bovernick
*Assistant Examiner*—Robert E. Wise
*Attorney, Agent, or Firm*—Armstrong, Westerman, Hattori, McLeland & Naughton

[57] ABSTRACT

A semiconductor light-emitting device comprising a substrate having thereon: a first conductive type first clad layer; an active layer; a second conductive type first clad layer having a stripe region to which a current is injected and the remaining region; a ridge portion comprising: a ridge-shape second conductive type second clad layer formed on the stripe region of the second conductive type first clad layer; a second conductive type contact layer formed on the ridge-shape second conductive type second clad layer; and a protective film formed on the second conductive type first clad layer to cover the remaining region thereof, wherein a part of the second conductive type second clad layer is formed on said protective film, or wherein said contact layer is formed on a substantially whole surface area of said second conductive type second clad layer, or wherein said ridge portion has no protective layer on the side surface thereof.

18 Claims, 7 Drawing Sheets

SEMICONDUCTOR LIGHT-EMITTING DEVICE

FIELD OF THE INVENTION

The invention relates to a semiconductor light-emitting device which can be suitably used as a ridge waveguide type semiconductor laser device that is capable of oscillating in a fundamental transverse mode.

BACKGROUND OF THE INVENTION

A production process of a conventional ridge waveguide type semiconductor laser device and a sectional view of the structure thereof is shown in FIGS. 2(a) to 2(c).

In the figure, 201 designates a substrate, 202 designates a first conductive type clad layer, 203 designates an active layer, 204 designates a second conductive type clad layer, 205 designates a second conductive type contact layer, 206 designates a protective film which is made of an insulator, 207 designates an electrode of the epitaxial side, and 208 designates an electrode of the substrate side.

A method of producing the conventional ridge waveguide type semiconductor laser device is as follows. First, a double heterostructure (hereinafter referred to as "DH") in which the active layer 203 is sandwiched from upside and downside between the two clad layers is produced (FIG. 2(a)). A ridge portion 209 is formed by an etching process using a stripe-like etching mask. During this process, in non-ridge portions 210, etching is performed to a middle level of the second conductive type clad layer 204 which is provided on the active layer 203 (FIG. 2(b)). Thereafter, the side surfaces of the ridge and the surfaces of the non-ridge portions are covered by the protective film 206, thereby preventing a current from flowing through a portion other than the top of the ridge. The electrode 207 is formed on the protective film and the upper portion of the ridge, and the electrode 208 is also formed on the substrate side.

According to this structure, a current is injected through the ridge portion of the clad layer, and then into the active layer 203. Therefore, the current is concentrated into the region of the active layer 203 which is under the ridge portion, so that light having a wavelength corresponding to the band gap of the active layer 203 is generated. Generally, the band gap of the active layer is smaller than those of the upper and lower clad layers, and the refractive index of the active layer is larger than those of the upper and lower clad layers. Consequently, carriers and light can be effectively confined in the active layer, and the threshold current for laser emission can be lowered.

In contrast, in the non-ridge portions 210, the protective film 206 which is smaller in refractive index than the semiconductor portions is formed, and hence the effective refractive index of the portions of the active layer 203 which are under the non-ridge portions 210 is smaller than that of the portion which is under the ridge portion 209. As a result, the generated light is confined in the active layer 203 which is under the ridge portion 209.

Because the electrode 207 is intended to contact only the contact layer which is at the top of the ridge portion, the conventional ridge waveguide type stripe semiconductor laser device is produced in the following manner. The surface of the epitaxial side is covered by the protective film 206. Thereafter, a stripe-like window is opened in the resist by a patterning process using the photolithography, and only a part of the protective film 206 which is above the ridge portion 209 is etched away, thereby exposing the contact layer 205. In some case, a protective film made of $SiN_x$ or the like is formed on the side walls of the ridge.

In a production of a laser device of a single transverse mode, usually, a very accurate positioning technique is required, because the width of the upper portion of the ridge is about several microns at maximum, and it is difficult to use in this process a process simplifying technique such as a self alignment. Such a photolithography technique which is complex and fine complicates the device production steps and lowers the device production yield.

When an $SiN_x$ film is formed on side walls of a ridge, a depletion layer (about 0.1 μm) is formed in the side faces of the ridge on the side of the surface, This produces a problem in that the effective width of the current channel is reduced and the pass resistance is increased.

In a conventional ridge waveguide type stripe semiconductor light-emitting device, moreover, the ridge portion is formed by an etching process, and hence it is difficult to set the thickness of an etched clad layer in the non-ridge portion on the active layer, and the width of the lower portion of the ridge to have a uniform value. As a result, even a very small difference of the thickness of the clad layer in the non-ridge portion causes the effective refractive index of the active layer in this portion to be largely varied, or the lateral width of the current injection region to be largely varied. Consequently, it is difficult to produce a semiconductor laser device in which the threshold current is low and the beam divergence has a desired constant value, at a high device yield and with excellent reproducibility.

In order to solve the problem regarding a thickness, a method is proposed in which the thickness of a clad layer above an active layer is accurately controlled by using the crystal growth rate upon a crystal growing process, a protective film made of an insulator is formed in an area other than a ridge portion, and the ridge portion is regrown (for example, JP-A-5-121822 (The term "JP-A" means a published unexamined Japanese application)). The production process and the structure of such a laser device is shown in FIGS. 3(a) to 3(c). The structure and the production method therefor is explained below. In the method, steps of forming a double heterostructure composed of a first conductive type clad layer 302, an active layer 303, and a second conductive type first clad layer 304 (FIG. 3(a)) are conducted in the same manner as those of the above described conventional technique. The method is characterized in that a second conductive type second clad layer 307 and a contact layer 308 are then selectively grown only in a stripe region 306 to a ridge-like shape by using a protective film 305 (FIG. 3(b)). The side faces and both sides of the ridge composed of the second conductive typo second clad layer 307 and the contact layer 308 are covered by a protective layer 310. Electrodes 309 are then formed on the upper and lower sides of the resulting product, respectively.

In this way, the ridge portion is formed by a method which does not use an etching process. Therefore, the thickness of the clad layer (304) which is above the active layer in the non-ridge portions can be accurately controlled, and the control of the effective refractive index can be easily performed.

In the above-described ridge waveguide structure, however, light leaks toward the electrode, in the vicinity of the boundary between the bottom of the ridge and the protective film. Because of light absorption and reflection due to the electrode metal, it is difficult to control the light distribution in the waveguide.

Moreover, when a light waveguide structure is to be formed in order to attain a single transverse mode, the ridge width of the top of the ridge must be set to be about 1 μm. In other words, the contact area between the contact layer and the electrode is very small, and hence the contact resistance between the contact layer and the electrode is increased. Furthermore, the oxidation of the surface of the clad layer on the side walls of the ridge causes degradation of the laser characteristics, reduction of the reliability, and the like. As a result, the laser characteristics of semiconductor light-emitting devices are varied and it is difficult to improve the product yield.

SUMMARY OF THE INVENTION

It is an object of the invention to provide a semiconductor light-emitting device which can be suitably used as a ridge waveguide semiconductor laser device that is capable of emitting in a fundamental transverse mode.

Other objects and effects of the present invention will become apparent form the following description.

The inventors have made extensive studies in order to solve the above-discussed problems, and found the followings, to thereby accomplish the invention.

(1) When a part of a clad layer of a ridge portion is formed on a protective film, light can be prevented from leaking into an electrode portion, the light distribution in a waveguide can be easily controlled, and the laser characteristics and the reliability are improved.

(2) When a contact layer is formed on a substantially whole surface of a ridge portion including the top and side surfaces of the ridge portion formed by regrowth, to increase the contact area between the contact layer and an electrode, the contact resistance is lowered and the oxidation of the surface of the clad layer on the side walls of the ridge is prevented from occurring.

(3) When a known ridge-shape semiconductor light-emitting device is provided with a structure in which both the side regions of a stripe region (i.e., the remaining regions) are covered by a protective film and the protective film is not formed on side surfaces of the ridge, the photolithography technique which is complex and fine is not required. Therefore, the device production steps can be simplified and the device production yield can be greatly improved. Furthermore, a semiconductor light-emitting device having such a structure can be easily produced by selective growth using a protective film.

That is, the above described objectives of the present invention have been achieved by the following constitutions.

(1) A first aspect of the invention relates to a semiconductor light-emitting device comprising a substrate having thereon:

a first conductive type first clad layer;

an active layer;

a second conductive type first clad layer;

a ridge-shape second conductive type second clad layer formed on a stripe region to which a current is injected;

a second conductive type contact layer; and a protective film formed on both sides of the stripe region, wherein a part of the second conductive type second clad layer is formed on the protective film.

(2) A second aspect of the invention relates to a semiconductor light-emitting device comprising a substrate having thereon:

a first conductive type first clad layer;

an active layer;

a second conductive type first clad layer;

a ridge-shape second conductive type second clad layer formed on a stripe region to which a current is injected;

a second conductive type contact layer; and a protective film formed on both sides of the stripe region, wherein the contact layer is formed on a substantially whole surface area of the second conductive type second clad layer.

In the semiconductor light-emitting devices of the above first and second aspects of the invention, it is preferred that the substrate has a zinc-blende crystal structure, the surface of the substrate being a (100) plane or a plane which is crystallographically equivalent thereto, and the stripe region elongating in a [0 1 −1]B direction or a direction which is crystallographically equivalent thereto.

In addition, the second conductive type first clad layer preferably has a refractive index larger than that of the second conductive type second clad layer.

Furthermore, the semiconductor light-emitting device preferably further comprises an oxidation inhibiting layer, the oxidation inhibiting layer being provided on at least the stripe region surface of the second conductive type first clad layer.

Additionally, in the above first aspect of the invention, the part of the second conductive type second clad layer which is formed on the protective film preferably has a width of from 0.01 μm to 2 μm.

(3) A third aspect of the invention relates to a semiconductor light-emitting device comprising a substrate having thereon:

a first conductive type first clad layer;

an active layer;

a second conductive type first clad layer;

a ridge portion comprising:

a ridge-shape second conductive type second clad layer formed on a stripe region to which a current is injected; and a second conductive type contact layer; and a protective film formed on both sides of the stripe region, wherein the ridge portion has no protective layer on the side surface thereof.

In the above third aspect of the invention, it is preferred that an electrode is formed to cover the side and upper surface of the ridge portion.

Further, the ridge-shape second conductive type second clad layer and the second conductive type contact layer are each preferably formed by selective growth.

Furthermore, the second conductive type first clad layer preferably has a refractive index larger than that of the second conductive type second clad layer.

Moreover, an oxidation inhibiting layer is preferably provided on at least the stripe region surface of the second conductive type first clad layer.

In another preferred embodiment of the semiconductor light-emitting device in the third aspect of the invention, the oxidation inhibiting layer comprises a material which is hardly oxidized or a material which, even when oxidized, is readily subjected to cleaning.

In a further other preferred embodiment of the third aspect of the present invention, the oxidation inhibiting layer is a semiconductor layer having a band gap energy larger than that of the active layer.

DETAILED DESCRIPTION OF THE INVENTION

Figure 1:
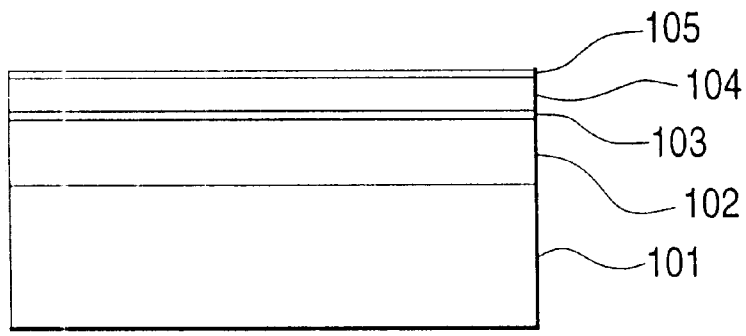
FIG. 1(a) to FIG. 1(c) are sectional views illustrating an embodiment of the semiconductor emitting device according to the present invention and the production process thereof.
Figure 1:
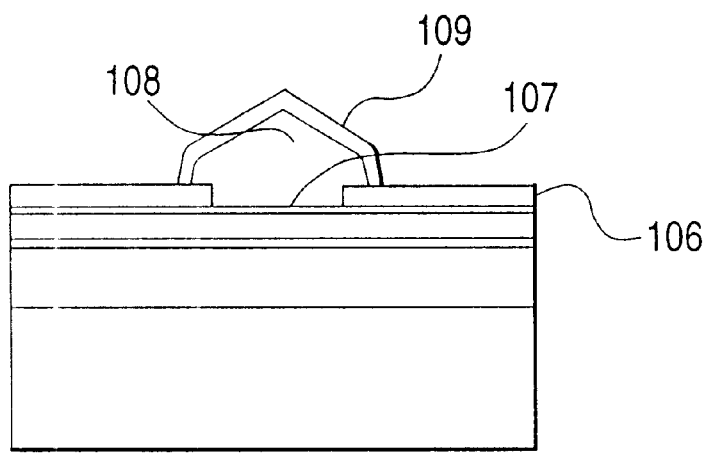
Figure 1:
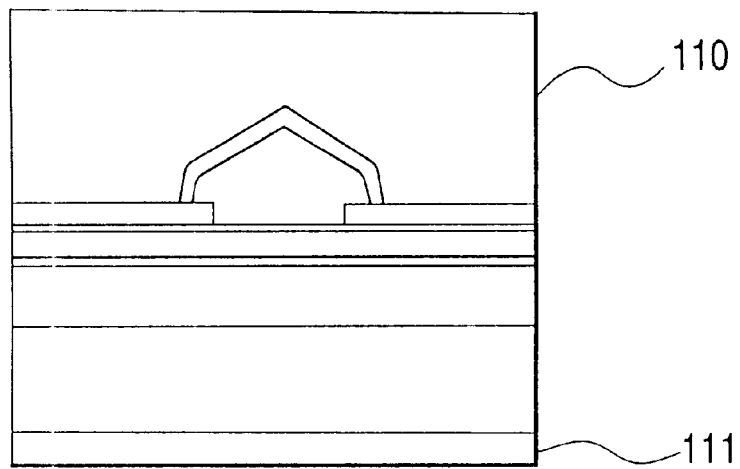
Figure 2:
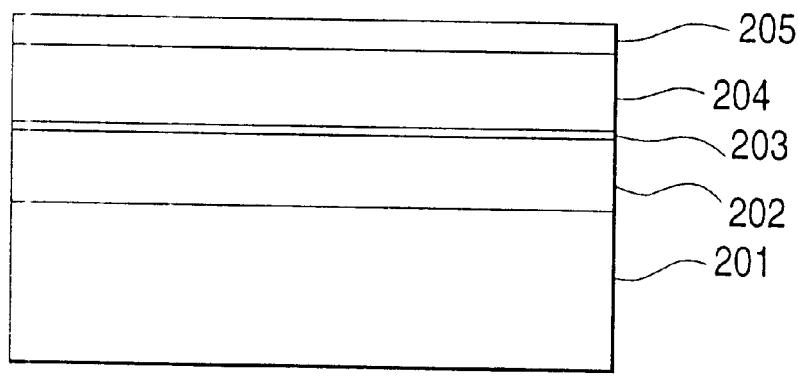
FIGS. 2(a) to 2(c) are sectional views illustrating a conventional semiconductor emitting device and the production process thereof, in which a ridge portion is formed by etching.
Figure 2:
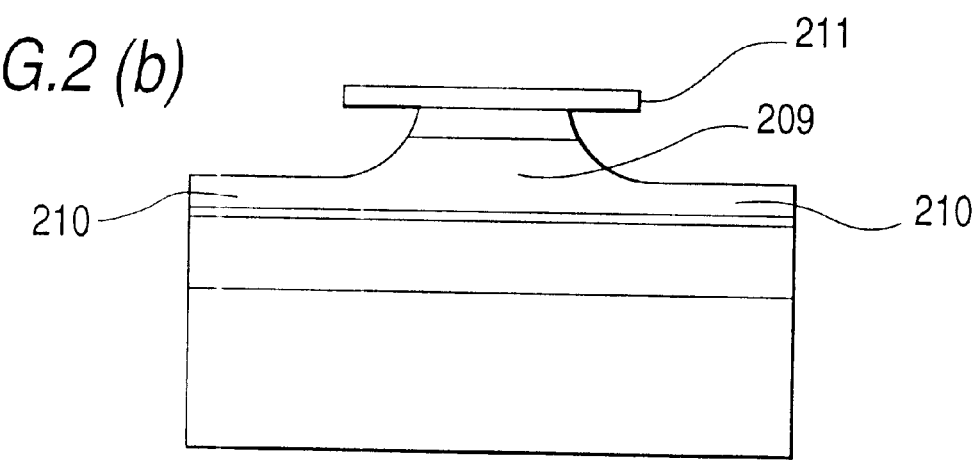
Figure 2:
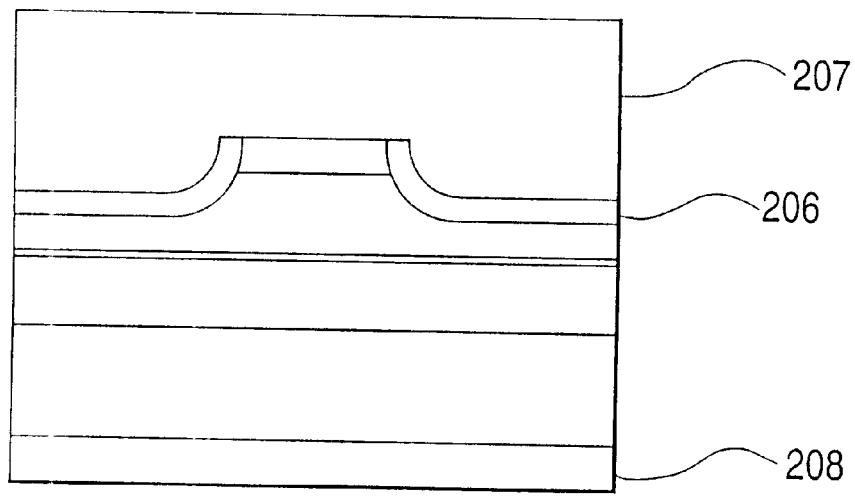

The present invention is described in detail below.

The crystal growing method for use in the production of the structure of the invention is not particularly limited. The crystal growth of the double heterostructure (DH), and the selective growth of the ridge portion may be performed by a known growth method such as metal organic chemical vapor deposition (MOCVD), molecular bean epitaxy (MBE), hydride or halide vapor phase epitaxy (VPE), or liquid phase epitaxy (LPE). Among these methods, MOCVD and MBE are preferred.

With respect to the substrate, the conductivity and the material are not particularly limited. However, it is preferable to use an electrically conductive material. Preferably, a semiconductor crystal substrate suitable for the crystalline thin film growth thereon, such as GaAs, InP, Si, or ZnSe, particularly, a semiconductor crystal substrate having a zinc-blende structure is preferably used. In this case, preferably, the (100) plane or a plane which is crystallographically equivalent to the (100) plane (collectively called "(100) plane") is used as the crystal growing surface. In the specification, "(x y z) plane" means not only the (x y z) plane itself but also a plane crystallographically equivalent to the (x y z) plane, and "[x y z] direction" means not only the (x y z) direction itself but also a direction crystallographically equivalent to the [x y z] direction. Specifically, in the specification, the term "(x y z) plane" means not only a plane which is strictly just as the (x y z) plane but also includes, in the meaning, planes having an off-angle of about 15° at maximum.

The clad layers, the active layer, and the contact layer are also not particularly limited. The double heterostructure may be produced by using a common group III–V or II–VI semiconductor such as AlGaAs, AlGaInP, GaInAsP, AlGaInN, BeMgZnSe, or CdZnSeTe. In this case, preferably, a material having a refractive index which is smaller than that of the active layer is selected as the clad layers, a material having a band gap energy which is smaller than that of the clad layers is usually selected as the contact layer, and in order to attain an ohmic contact with a metal electrode, the contact layer has a low resistance and an appropriate carrier concentration, namely, about from $1\times 10^{18}$ to $5\times 10^{19}$, more preferably, about from $5\times 10^{18}$ to $2\times 10^{19}$. A layer made of the same material as used for the second conductive type second clad layer but with higher carrier concentration than that of the second conductive type second clad layer can be selected as the contact layer. Also, the surface side portion of the second conductive type second clad layer can be used as the contact layer when the carrier concentration of the surface side portion is made higher than that of the other portion of the second conductive type second clad layer. The active layer is not limited to a structure which consists of a single layer, and also includes the single quantum well structure (SQW) composed of a quantum well layer and optical guide layers which vertically sandwich the quantum well layer, and the multiple quantum well structure (MQW) composed of plural quantum well layers, a barrier layer sandwiched between the quantum well layers, and optical guide layers which are respectively formed on the uppermost quantum well layer, and under the lowermost quantum well layer.

The protective film is also not particularly limited. In order to confine the injection current to the region of the active layer under the ridge portion, however, the protective film must be insulative. A configuration in which, with respect to light generated in the active layer, the effective refractive index of the active layer under the ridge portion is larger than that of the active layer under the non-ridge portions is effective for stabilizing the transverse mode of laser oscillation and reduce the threshold current. Preferably, the refractive index of the protective film is smaller than that of the clad layer on the ridge portion. In a practical use, however, an excessively small refractive index tends to increase the effective refractive index step in the transverse direction in the active layer, and hence the first clad layer under the ridge must be thick. By contrast, when the refractive index is too large, light easily leaks to the outside of the protective film, and hence the protective film must be made thicker to a certain degree. This causes a problem in that the cleavage property is impaired. Considering these problems, it is preferred to set the refractive index difference between the protective film and the clad layer of the ridge portion to be 0.1 to 2.5, more preferably 0.2 to 2.0, and most preferably 0.7 to 1.8. The protective film may have any thickness as far as it exhibits a sufficient insulation property and light does not leak to the outside of the protective film. The thickness of the protective film is preferably set to be 10 to 500 nm, more preferably 50 to 300 nm, and most preferably 100 to 200 nm. When the ridge portion is to be formed by selective regrowth conducted by MOCVD or the like with using the protective film as a mask, a dielectric suitable for the purpose, such as $SiN_x$, $SiO_2$ or $Al_2O_3$ is preferably used. In the case where the surface of the substrate is the (1 0 0) plane or a plane which is crystallographically equivalent to the (1 0 0) plane, in order to cause the second conductive type second clad layer to be easily grown on the protective film and the contact layer (which is described later) to be easily grown on the side surfaces of the ridge (the second conductive type second clad layer), a stripe region which is defined by an opening of the protective film preferably elongates in the [0 1 −1]B direction or a direction which is crystallographically equivalent to the direction. In this case, it is often that most of the side surfaces of the ridge are configured by the (3 1 1)A plane and (3 −1 −1)A plane, and it is possible to grow the contact layer on a substantially whole area of the growing surface of the second conductive type second clad layer which constitutes the ridge. This tendency is particularly noticeable when the second conductive type second clad layer is made of AlGaAs, particularly, having an Al concentration of 0.2 to 0.9, preferably, 0.3 to 0.7. In the specification, the term "[0 1 −1]B direction" defines the [0 1 −1]B direction so that, in a usual group III–V or II–VI semiconductor, the (1 1 −1) plane existing between the (1 0 0) plane and the (0 1 −1) plane is a plane in which the element of group V or VI appears. Furthermore, the term is not limited to a direction which is strictly just as the [0 1 −1]S direction and includes directions which are deviated from the [0 1 −1]B direction by about ±10°. The embodiment of the invention is not limited to the case where the stripe region elongates in the [0 1 −1]B direction. Hereinafter, other embodiments are described.

In the MOCVD method, for example, when the growth conditions are suitably selected, i.e., when the stripe region which is defined by the opening of the protective film is set to elongate in the [0 1 1]A direction, the growth rate can be provided with anisotropy. Namely, the growth rate can be set so that the growth is rapid in the (1 0 0) plane and is hardly conducted in the (1 −1 1)B plane and (1 1 −1)B plane. When selective growth is performed in the (1 0 0) plane of the stripe-like window under such anisotropic conditions, a ridge in which a side face is the (1 −1 1)B plane and (1 1 −1)B plane is formed. In this case, when conditions of the MOCVD method are selected so that growth of higher isotropy occurs, the contact layer can be formed on the top of the ridge which is the (1 0 0) plane, and also on the ridge side face composed of the (1 1 1)B plane.

The method of producing the semiconductor light-emitting device of the first aspect of the invention is not particularly limited. Generally, the double heterostructure is formed on the substrate, and the second conductive type second clad layer and the contact layer which constitute a ridge shape are then selectively grown, by using the protective film, on the stripe region into which a current is injected. At this times in order to enable a part of the second conductive type second clad layer to be formed on the protective film, conditions are set in which the second conductive type second clad layer easily grows in a direction vertical to the direction along which the stripe region elongates within the substrate surface plane, or, in other words, a condition where a lateral growth suitably occurs. Specifically, when the surface of the substrate is the (1 0 0) plane, the direction along which the stripe region defined by the opening of the protective film is set to be the [0 1 −1]B direction, and the temperature, the supply amount of the raw material, and the like are appropriately adjusted. When the second conductive type second clad layer is made of a III–V compound semiconductor, a lateral growth occurs more easily as the temperature is lower and the V/III ratio is larger. When a composition containing Al is used, a lateral growth occurs more easily as the Al content is higher. In order to prevent light from leaking and control the light distribution in the waveguide, preferably, these growth conditions are adjusted so that the respective parts of the second conductive type second clad layer which overlap with the protective film is 0.01 to 2 μm, more preferably, about 0.1 to 1 μm.

The method of producing the semiconductor light-emitting device of the second aspect of the invention is not particularly limited. Generally, the double heterostructure is formed on the substrate, the second conductive type second clad layer which constitutes a ridge shape is then selectively grown by using the protective film on the stripe region into which a current is injected, and the contact layer is formed on a substantially whole surface of the second conductive type second clad layer of the ridge shape.

Figure 4A:
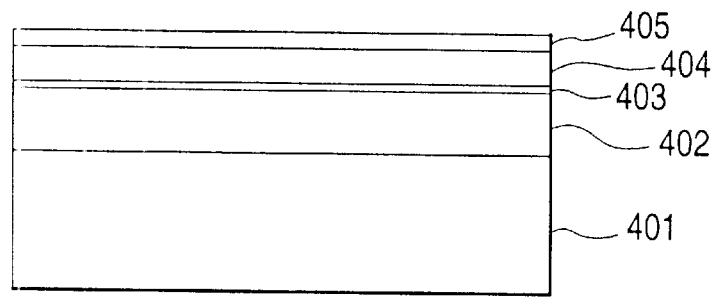
FIGS. 4(a) to 4(c) are sectional views illustrating one embodiment of the semiconductor emitting device and the production process thereof according to the third aspect of the invention.
Figure 4B:
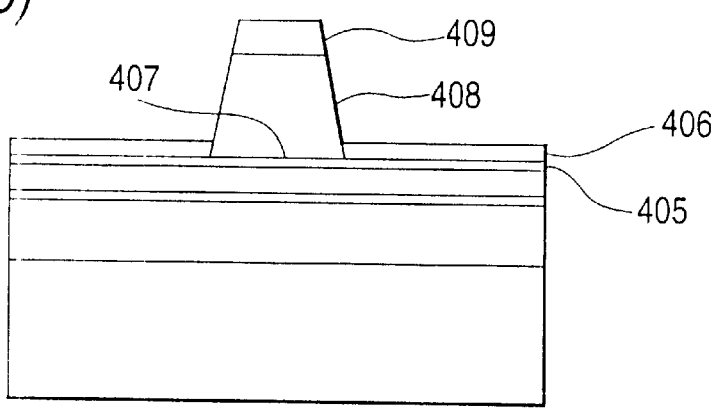
Figure 4C:
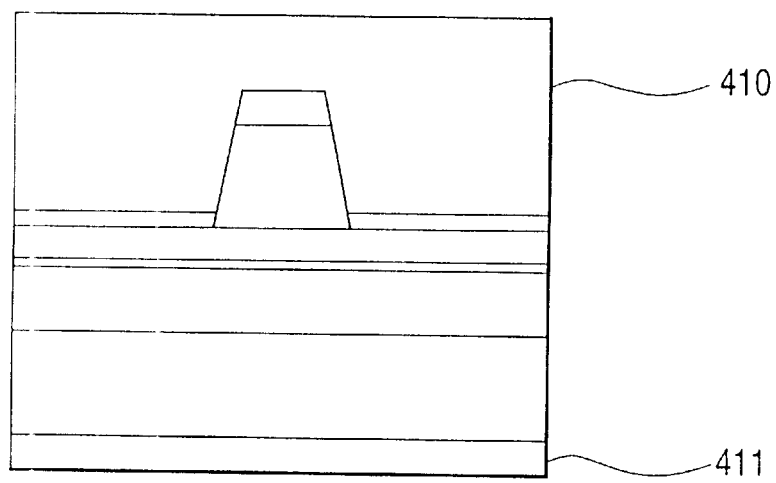

The method of producing the semiconductor light-emitting device of the third aspect of invention is also not particularly limited. An example of the production method and the structure of the device of the third aspect of the invention is illustrated in FIGS. 4(a) to 4(c). That is, the double heterostructure composed of an active layer 403 sandwiched between a first conductive type clad layer 402 and a second conductive type first clad layer 404 is formed on a substrate 401. On the second conductive type first clad layer 404, an oxidation inhibiting layer 405 is formed (FIG. 5(a)). Then, a second conductive type second clad layer 408 and a contact layer 409 which constitute a ridge portion are selectively grown on a stripe region 407 formed in a protective film 406. Thereafter, an epitaxial side electrode 410 is formed on the side and upper surfaces of the ridge without forming a protective film on the side surfaces of the ridge, and a substrate side electrode 411 is formed on the substrate.

In a preferred embodiment of the first aspect of the invention, the second conductive type contact layer is formed in a substantially whole area (including the upper and side surfaces) of the ridge. According to this configuration, the contact area between the contact layer and the electrode can be increased and the contact resistance can be reduced.

The semiconductor device of the second aspect of the invention has a feature that the contact layer is formed on a substantially whole area of the ridge-shape second conductive type second clad layer, such as the side and upper surfaces. This feature enables the second conductive type second clad layer and the contact layer to have a sufficient contact area, whereby the total resistance of the device can be suppressed to a small value. With the objective of prevention of oxidation, or the like, the part of side and top surfaces of the ridge on which the contact layer is formed may be further covered by a protective film. In this case also, the total resistance of the device can be suppressed to a smaller value than that obtained in the case where the protective film is formed without forming the contact layer on the side surfaces of the ridge. Insofar as this point, this case is within the scope of the invention.

In a preferred embodiment of the second aspect of the invention, a part of the second conductive type second clad layer is formed on an insulating layer. According to this configuration, it is possible to improve the controllability of the distribution of light which leaks to the vicinity of the boundary between the protective film and the bottom of the ridge.

The semiconductor light-emitting device of the third aspect of the invention may be configured in the following manner. The clad layer of the regrowth portion is grown so as to overlap with the upper face of the protective film made of an insulator, thereby improving the controllability of the distribution of light which leaks to the vicinity of the protective film and the ridge. The contact layer of the regrowth portion is grown so as to overlap with the upper face of the protective film, thereby suppressing the oxidation of the side surfaces of the clad layer. The contact area of the electrode of the epitaxial side is increased so that the contact resistance of the electrode is reduced. These processes of growing the clad layer and the contact layer of the regrowth portion so as to overlap with the insulating film may be independently conducted or alternatively both the processes may be conducted in combination.

In the invention, other conditions such as growth conditions of each of the layers are varied depending on the composition of the layer and the growth method. In the case where a layer of a III–V compound semiconductor is grown by using the MOCVD method, preferably, the double heterostructure is formed at the growth temperature of about 700° C. and the V/III ratio of about 25 to 45, and the ridge portion is formed at the growth temperature of 630 to 700° C. and the V/III ratio of about 45 to 55. In the case where the ridge portion which is selectively grown by using the protective film is made of III–V compound semiconductor layer containing Al (especially with an Al concentration of 0.3 or higher) such as AlGaAs, particularly, polycrystals are prevented from depositing on the mask by introducing a slight amount of HCl gas during growth. Therefore, this is very preferable. In this case, when an excessive amount of HCl gas is introduced, the AlGaAs layer is not grown and, the semiconductor layer is etched away (etching mode). The optimum introducing amount of HCl largely depends on the number of moles of the supplied material of group III containing Al, such as trimethyl aluminum. Specifically, it is preferable to set the ratio of the number of moles of the supplied HCl to that of the supplied material of group III containing Al (HCl/group III) to be 0.01 or larger and 50 or less, more preferably, 0.05 or larger and 10 or less, and, most preferably, 0.1 or larger and 5 or less.

In the present invention, the refractive index of the second conductive type first clad layer is preferably larger than that of the second conductive type second clad layer.

When the ridge portion is to be regrown, usually, the growing process is performed so that the second conductive type second clad layer has the same composition as the second conductive type first clad layer of the DH structure which is initially grown. Even when the second conductive type second clad layer is attempted to be regrown in the same composition, the composition may be varied depending on the conditions of the regrowth process, and it is not necessary to have the same composition. The configuration in which the refractive index of the second conductive type second clad layer is smaller than that of the second conductive type first clad layer of the DH structure is not preferred, because the beam divergence vertical to the active layer is largely varied by a change of the refractive index of the second conductive type second clad layer as the regrowth portion.

A further preferred embodiment of the invention is that an oxidation inhibiting layer is formed on the second conductive type first clad layer to cover at least the stripe region (more preferably, the stripe region and both the side regions (the remaining region)). According to this configuration, when the clad layer of the ridge portion is formed by regrowth, a high resistance layer which may increase the pass resistance can be prevented from being produced in the interface of the regrowth.

The kind of the oxidation inhibiting layer for use in the invention is not particularly limited, as far as it is a layer which does not absorb light from the active layer (by, for example, selecting the material or the thickness) or it is made of a material which is hardly oxidized or a material which, even when oxidized, is readily cleaned. Usually, a semiconductor layer having a band gap energy which is larger than that of the active layer is selected as the oxidation inhibiting layer. A semiconductor layer having a band gap energy not larger than that of the active layer can also be used for as the oxidation inhibiting layer, when the layer thickness is not greater than 50 nm, preferably not greater than 30 nm, more preferably not greater than 10 nm.

The oxidation inhibiting layer is preferably doped, but an undoped layer can also be used as the oxidation layer when the layer thickness is not greater than 50 nm, preferably not greater than 30 nm, more preferably not greater than 10 nm.

In the case where more than one ridge portions are formed by regrowth, a ridge dummy layer having a larger area than the ridge portion into which a current is injected may be disposed between the ridge portions in order to improve the controllability of the composition of the ridge portion, the carrier concentration, and the growth rate.

Figure 5A:
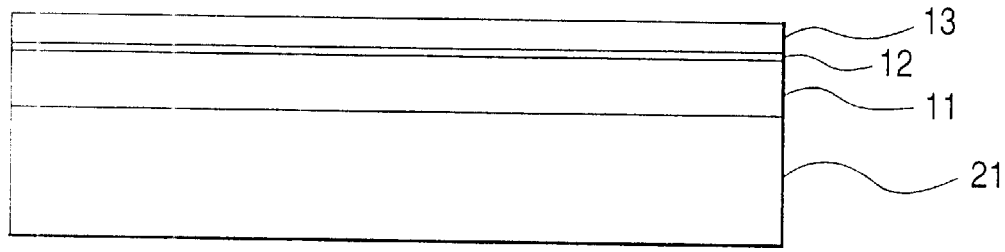
FIGS. 5(a) to 5(c) are sectional views illustrating a preferred embodiment of the semiconductor emitting device and the production process thereof according to the present invention.
Figure 5B:
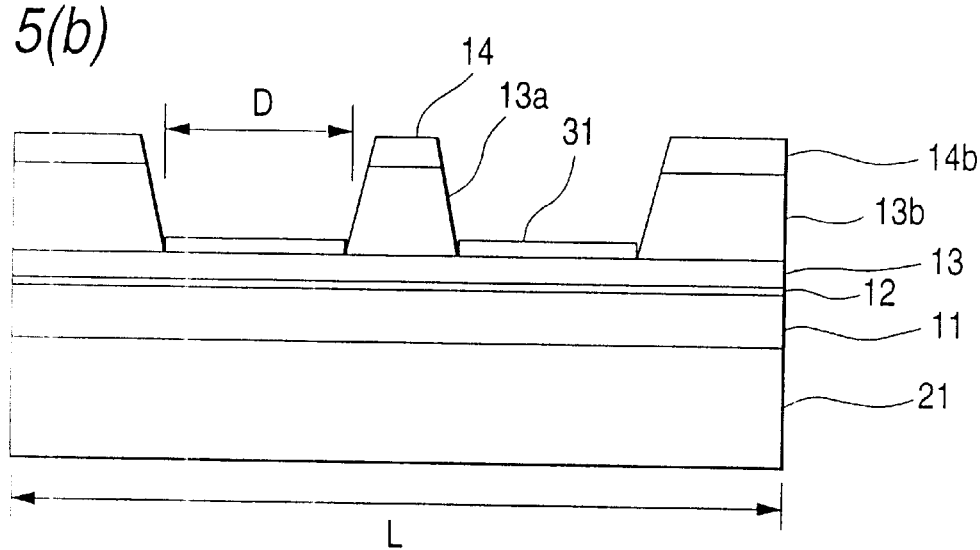
Figure 5C:
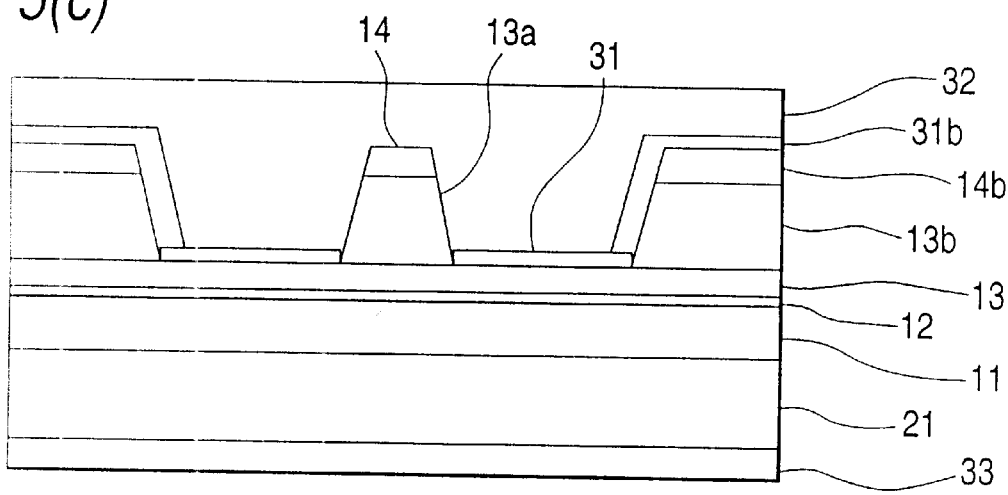

For example, such a structure may be produced in the following manner. As shown in FIGS. 5(a) to 5(c), first, a first conductive type clad layer 11, an active layer 12, and a second conductive type clad layer 13 are sequentially grown on a substrate. An insulating layer 31 is then deposited, and a stripe-like window is opened by the photolithography technique in the insulating layer at portions corresponding to the ridge portion or ridge dummy portions to be formed. A second conductive type clad layer and a contact layer are formed in each of the windows, As a result, a second conductive type clad layer 13a and a contact layer 14 are deposited in the ridge portion, and layers 13b and 14b which respectively correspond to the clad layer and the contact layer are deposited in the ridge dummy portions. On the whole surface of the obtained structure, an electrode 32 is formed.

The ridge dummy portions should be formed to have a structure which causes the current to be concentrated in the ridge portion so that the laser oscillation occurs only in the ridge portion. In the structure shown in FIG. 5(c), therefore, the current is prevented from flowing through the ridge dummy portions, by forming an insulating film 31b in the ridge dummy portions. Alternatively, a structure in which the current is prevented from flowing through the ridge dummy portions may be realized by a method such that only the portions are formed into a thyristor structure, or that an insulator is formed by using an oxide film of a semiconductor or a metal.

In the structure described above, preferably, the ratio D/L of the width D of the insulating layer 31 to the repetition width L of the ridge portion is 0.001 or larger and 0.25 or less. This characteristic facilitates the control of the thickness of the ridge portion and the carrier concentration. When each of the width D of the protective film and the repetition width L of the ridge portion has the same value in the repetition units, the width may be set to have the same value, and when each of the widths is fluctuated in the repetition units, the width may be set to be the average value of the repetition units.

Thus, the invention may be applied to various kinds of ridge stripe waveguide type semiconductor light-emitting devices. This structure may be applied also to an LED of the end-face emission type.

Figure 6:
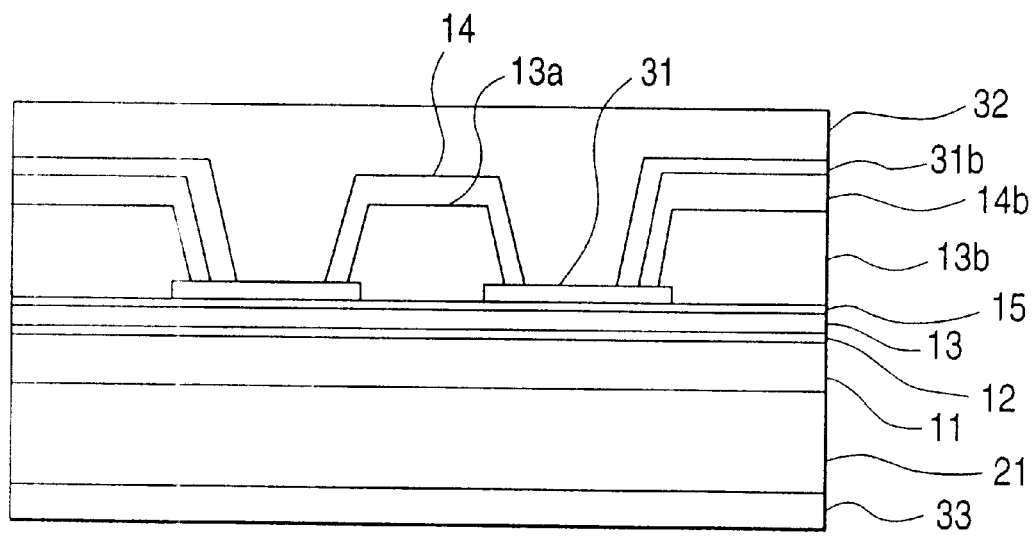
FIG. 6 is a sectional view illustrating another preferred embodiment of the semiconductor emitting device of the present invention.

In the most preferable embodiment to which the invention is applied, as shown in FIG. 6, an oxidation inhibiting layer 15 is formed on the surface of the DH structure on tho tide of the epitaxial face. In this state, a clad layer 13a of a ridge shape, and a contact layer 14 above the clad layer are regrown, by using a protective film made of an insulator, on the stripe region into which a current is injected, so as to overlap with a protective film 31 made of an insulator. In this case, a ridge dummy layer which is larger in area than the ridge portion and into which a current is not injected is disposed, a protective film made of an insulator is not formed on the side surfaces of the ridge, and an electrode is formed on the upper and side surfaces of the ridge. The electrode nay be formed only on the upper and side surfaces of the ridge. Alternatively, as shown in FIG. 6, a protective film made of an insulator may be formed on the whole face of the ridge dummy layer, and the electrode may be formed on the side of the epitaxial face.

Usually, a laser chip which is divided by cleavage from the above-mentioned wafer having the electrodes is integrated with a heat sink and a photodiode for monitoring an optical output, with encapsulating them into a CAN package under a nitrogen atmosphere. Recently, in order to reduce the size and the production cost, such a laser chip may be sometimes assembled into an integrated optical pickup in which the laser chip is integrated with optical parts.

The invention will be described in greater detail with reference to the following Examples. The present invention should not be construed as being limited thereto.

EXAMPLE 1

Example 1 is illustrated in FIGS. 1(a) to 1(c). An n-type buffer layer (not shown in FIGS. 1(a) to 1(c)) made of Si-doped GaAs (n=1×10$^{18}$ cm$^{-3}$) and having a thickness of 0.5 μm, a first n-type clad layer 102 made of Si-doped Al$_x$Ga$_{1-x}$As (x=0.55; n=1×10$^{18}$ cm$^{-3}$) and having a thickness of 1.5 μm, an active layer 103 made of non-doped Al$_x$Ga$_{1-x}$As (x=0.14) and having a thickness of 0.06 μm, a first p-type clad layer 104 made of Zn-doped Al$_x$Ga$_{1-x}$As (x=0.55; p=1×10$^{18}$ cm$^{-3}$) and having a thickness of 0.35 μm, and an oxidation inhibiting layer 105 made of Zn-doped Al$_x$Ga$_{1-x}$As (x=0.2; p=1×10$^{18}$ cm$^{-3}$) and having a thickness of 10 nm were sequentially grown by the MOCVD method on an n-type GaAs substrate 101 (n=1×10$^{18}$ cm$^{-3}$) having a thickness of 350 μm and a (1 0 0) plane surface, to thereby form a double heterostructure (FIG. 1(a)). An SiN$_x$ protective film 106 was then deposited to a thickness of 200 nm on the substrate of the double heterostructure substrate. Many stripe-like windows 107 elongating in the [0 1 −1]B direction and having a width of 2.2 μm were opened in the SiN$_x$ protective film by a photolithography technique. At this time, the width D of each of the remaining portions of the SiN$_x$ protective film which respectively remain on the sides of the stripe region was set to be 10 μm, and the repetition width L of the ridge portions to be 250 μm (D/L=0.04). A second p-type clad layer 108 made of Zn-doped Al$_x$Ga$_{1-x}$As (x=0.57; p=1×10$^{18}$ cm$^{-3}$) and having a thickness of 1.25 μm was grown on each of the stripe-like windows 107 by selective growth using an MOCVD method. The second p-type clad layer of Zn-doped Al$_x$Ga$_{1-x}$As (x=0.57) had a ridge shape in which the facet is mainly constituted by the (3 1 1)A plane and (3 −1 −1)A plane. Next, a p-type contact layer 109 made of Zn-doped GaAs having a carrier concentration of 1×10$^{19}$ was formed on the second p-type clad layer, by selective growth using an MOCVD method. The p-type contact layer of Zn-doped GaAs was grown in a substantially isotropic manner on the ridge-shape second p-type clad layer 108 made of Zn-doped Al$_x$Ga$_{1-x}$As (x=0.57), to form the p-type contact layer 109 which covers the whole surface of the ridge and has a thickness of 0.2 μm (FIG. 1(b)).

In the MOCVD method, trimethyl gallium, (TMG) and trimethyl aluminum (TMA) were used as the raw material of group III, arsine was used as the raw material of group V, and hydrogen was used as the carrier gas. Dimethyl zinc was used as the p-type dopant and disilane as the n-type dopant. During the growth of the ridge, HCl gas was introduced so that the HCl/III group element molar ratio was 0.12 and, particularly, the HCl/TMA molar ratio was 0.22.

Figure 7:
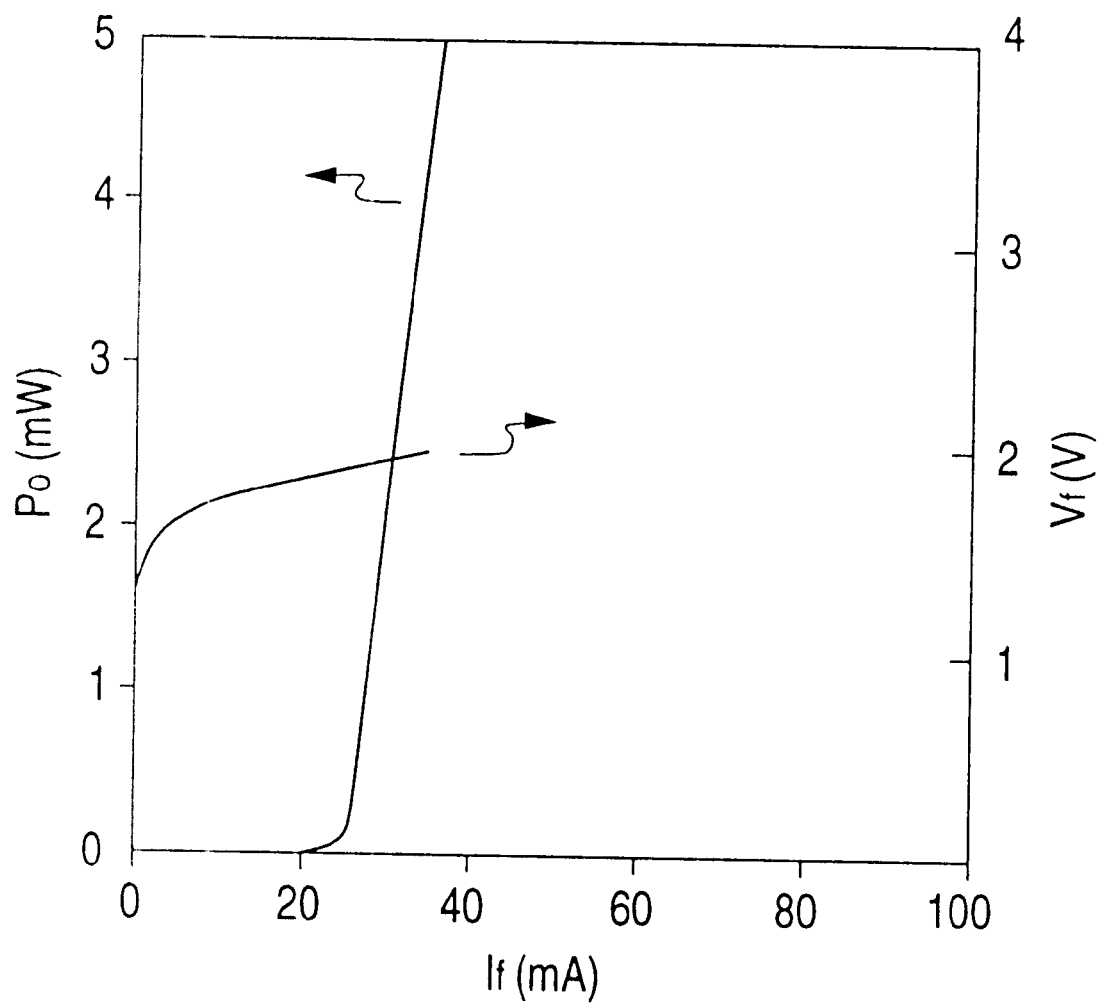
FIG. 7 is a graph showing the current-voltage and current-output characteristics of the semiconductor emitting device used in Example 1.

Thereafter, a p-side electrode 110 was formed by evaporation, and the thickness of the substrate was reduced to 100 μm. An n-side electrode 111 was then formed by evaporation, and an alloying process was performed (FIG. 1(c)). A chip was divided from the thus produced wafer by cleavage to form a laser oscillator structure. The cavity length was 250 μm. After the device was assembled with junction up, current-voltage and current-output characteristics were measured under continuous wave (CW) at 25° C. As shown in FIG. 7, the thus produced laser device had very excellent current-voltage and current-output characteristics. The threshold voltage was 1.7 V, which is a low value corresponding to the band gap of the active layer. From this, it was ascertained that a high resistance layer does not exist in the device, The series resistance was as low as 5 to 6 Ω. From this, it was ascertained that the contact resistance between the p-type contact layer and the p-side electrode has a very small value. In the case where a laser device which performs a self-pulsation of a low output so as to be used as a light source for reading a compact disk or the like was formed. A typical product specification is as shown in Table 1. The laser device produced in this example exhibited very excellent characteristics such as an average threshold current of 25 mA and an average slope efficiency of 0.56 mW/mA, and it was ascertained that the reliability of the device is high. Furthermore, it was ascertained that the characteristics are little dispersed in a batch and among batches and the production yield in the case of the product specification listed in Table 1 has a value in the vicinity of 100%. According to observation using a SEM, it was confirmed that, as shown in the sectional diagram of FIG. 1(c), the ridge-shape second p-type clad layer (second conductive type second clad layer) made of Zn-doped Al$_x$Ga$_{1-x}$As (x=0.57) overlaps with the protective film made of SiN$_x$ by a length of about 0.4 μm. The protective film was not formed on the side surfaces of the ridge.

In the characteristics of the thus produced laser device, it was ascertained that the far-field pattern as designed is obtained and the light distribution can be controlled in a very satisfactory manner.

The production of a semiconductor laser device was conducted five times while changing the composition of the second p-type clad layer as shown in Table 2 below, and the beam spread angle of light vertical to the active layer was measured. The results are also listed in Table 2.

When the composition of the second p-type clad layer of the regrown ridge portion was higher than the composition (0.55) of the first p-type clad layer above the active layer, i.e., the refractive index of the second p-type clad layer was made smaller, the beam spread angle of light vertical to the active layer was increased only by about 4 degrees for a change of 0.05 of the composition of the second p-type clad layer (growth No. 3 to growth No. 1). From this, it is apparent that the reproducibility with respect to the dispersion of the composition during growth is excellent.

On the other hand, when the composition of the second p-type clad layer was lower than the composition of the first p-type clad layer, i.e., the refractive index of the second p-type clad layer was made larger, the beam spread angle of light vertical to the active layer was reduced by about 10 degrees for a change of 0.05 of the composition of the second p-type clad layer (growth No. 3 to growth No. 5). From this, it can be seen that the reproducibility with respect to the dispersion of the composition during growth is low.

TABLE 1

Threshold current: Ith ≦ 30 mA
Threshold voltage: Vth ≦ 2.0 V
Operation current: Iop ≦ 37 mA
Operation voltage: Vop ≦ 2.3 V
Slope efficiency: 0.4 ≦ SE ≦ 0.7
Vertical beam spread angle: 30° ≦ θv ≦ 40°
Horizontal beam spread angle: 8° ≦ θh ≦ 14°
Wavelength: 780 nm ≦ λ ≦ 810 nm
Coherency: γ ≦ 0.95
(at 25° C. and 3 mW except for Ith and Vth)

TABLE 2

| Growth No. | Composition x | Refractive index | Beam spread angle |
|---|---|---|---|
| 1 | 0.600 | 3.217 | 36.8 |
| 2 | 0.575 | 3.232 | 35.6 |
| 3 | 0.500 | 3.248 | 33.0 |
| 4 | 0.525 | 3.263 | 30.5 |
| 5 | 0.500 | 3.279 | 22.6 |

Comparative Example 1

Figure 3A:
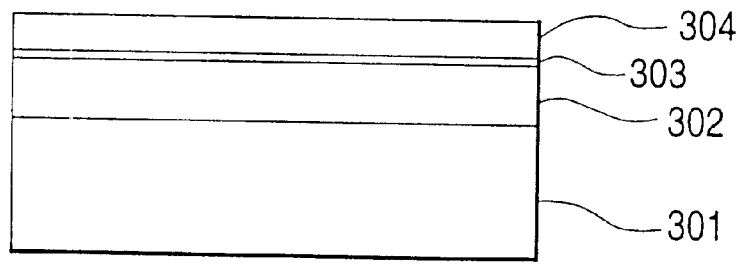
FIGS. 3(a) to 3(c) are sectional views illustrating a conventional semiconductor emitting device used in Comparative Example 1 and the production process thereof, where a ridge portion surface, only excluding the top surface thereof, is covered by a protective layer.
Figure 3B:
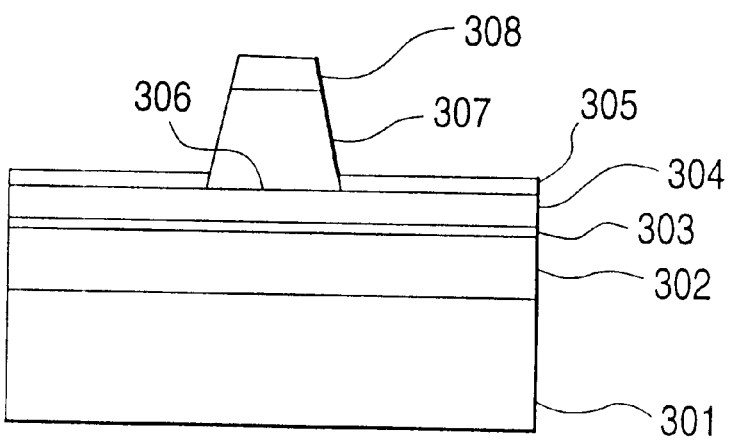
Figure 3C:
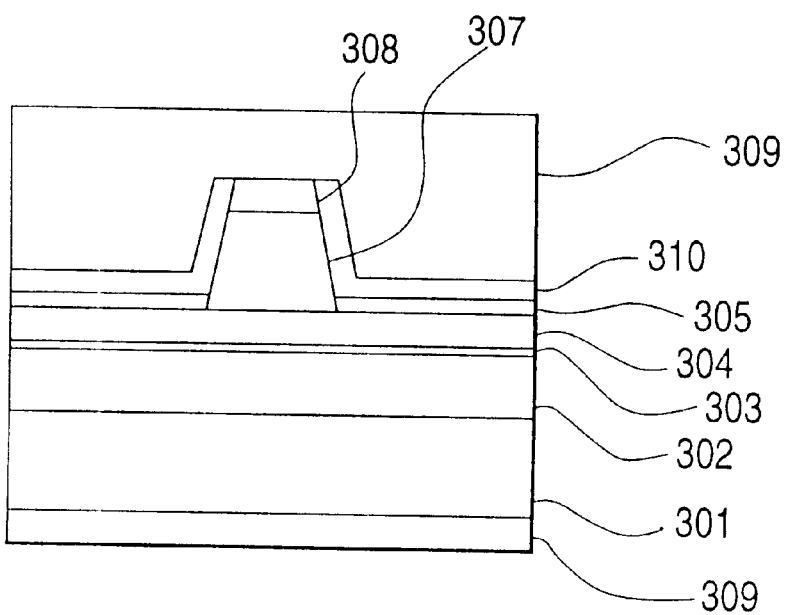

Comparative Example 1 is illustrated in FIGS. 3(a) to 3(c). A ridge was formed on the substrate of the double heterostructure in the same manner as Example 1, except that the stripe-like windows which were opened in the $SiN_x$ protective film 305 elongate in the [0 1 1]A direction. As shown in FIG. 3(b), the formed ridge had a contact layer only on the top thereof, and side faces of the (1 −1 1)B plane and (1 1 −1)B plane, and any part of the ridge did not overlap with the protective film. Thereafter, a semiconductor laser chip was produced in the same manner as Example 1, except that, before a p-side electrode 309 was formed by evaporation on the side of the epitaxial face, the surface of the epitaxial side was covered by the $SiN_x$ protective film 310, a stripe-like window was opened in the resist by a patterning process using a photolithography technique, and only the portion of the protective film 310 present above the ridge was etched away, thereby exposing the contact layer 308.

The distribution of the characteristics of thus produced laser chips in a batch and among batches were measured. As a result, the threshold current was about 28 mA, the slope efficiency was about 0.5 mW/mA, the threshold voltage was about 2.2 V, and the series resistance was about 8 Ω. These characteristics were largely dispersed, and the device yield was as small as about 50%. According to observation of the section shape and the like, the product was confirmed to have a configuration in which the electrode is made contact with only the contact layer at the top of the ridge portion. Because of the intention to obtain such a configuration, the photolithography technique which is complex and fine was required. As a result, the device characteristics were impaired in a portion formed with a process failure, and the yield was lowered, While the invention has been described in detail and with reference to specific embodiments thereof, it will be apparent for one skilled in the art that various changes and variations can be made therein without departing from the spirit and scope thereof.

What is claimed is:

1. A semiconductor light-emitting device comprising a substrate having thereon:
   a first conductive type first clad layer;
   an active layer;
   a second conductive type first clad layer;
   a ridge-shape second conductive type second clad layer formed on a stripe region to which a current is injected;
   a second conductive type contact layer; and
   a protective film formed on both sides of the stripe region,
   wherein a part of said second conductive type second clad layer is formed on said protective film.

2. The semiconductor light-emitting device according to claim 1, wherein said substrate has a zinc-blend crystal structure, the surface of said substrate being a (100) plane or a plane which is crystallographically equivalent thereto, and said stripe region elongating in a [0 1 −1]B direction or a direction which is crystallographically equivalent thereto.

3. The semiconductor light-emitting device according to claim 1, wherein said second conductive type first clad layer has a refractive index larger than that of said second conductive type second clad layer.

4. The semiconductor light-emitting device according to claim 1, further comprising an oxidation inhibiting layer, said oxidation inhibiting layer being provided on at least the stripe region surface of said second conductive type first clad layer.

5. The semiconductor light-emitting device according to claim 1, wherein said part of the second conductive type second clad layer, which is formed on said protective film, has a width of from 0.01 μm to 2 μm.

6. A semiconductor light-emitting device comprising a substrate having thereon:
   a first conductive type first clad layer;
   an active layer;
   a second conductive type first clad layer;
   a ridge-shape second conductive type second clad layer formed on a stripe region to which a current is injected;
   a second conductive type contact layer; and
   a protective film formed on both sides of the stripe region,
   wherein said contact layer is formed on a substantially whole surface area of said second conductive type second clad layer.

7. The semiconductor light-emitting device according to claim 6, wherein said substrate has a zinc-blend crystal structure, the surface of said substrate being a (100) plane or a plane which is crystallographically equivalent thereto, and said stripe region elongating in a [0 1 −1]B direction or a direction which is crystallographically equivalent thereto.

8. The semiconductor light-emitting device according to claim 6, wherein said second conductive type first clad layer has a refractive index larger than that of said second conductive type second clad layer.

9. The semiconductor light-emitting device according to claim 6, further comprising an oxidation inhibiting layer, said oxidation inhibiting layer being provided on at least the stripe region surface of said second conductive type first clad layer.

10. A semiconductor light-emitting device comprising a substrate having thereon:
    a first conductive type first clad layer;
    an active layer;
    a second conductive type first clad layer;
    a ridge portion comprising:
       a ridge-shape second conductive type second clad layer formed on a stripe region to which a current is injected; and
       a second conductive type contact layer; and
    a protective film formed on both sides of the stripe region, wherein said ridge portion has no protective layer on the side surface thereof.

11. The semiconductor light-emitting device according to claim 10, further comprising an electrode formed to cover the side and upper surface of said ridge portion.

12. The semiconductor light-emitting device according to claim 10, wherein said second conductive type second clad layer and said ridge-shape second conductive type contact layer are each formed by selective growth.

13. The semiconductor light-emitting device according to claim 10, wherein said second conductive type first clad layer has a refractive index larger than that of said second conductive type second clad layer.

14. The semiconductor light-emitting device according to claim 10, further comprising an oxidation inhibiting layer, said oxidation inhibiting layer being provided on at least the stripe region surface of said second conductive type first clad layer.

15. The semiconductor light-emitting device according to claim 14, wherein said oxidation inhibiting layer comprises a material which is hardly oxidized or a material which, even when oxidized, is readily subjected to cleaning.

16. The semiconductor light-emitting device according to claim 14, wherein said oxidation inhibiting layer is a semiconductor layer having a band gap energy larger than that of said active layer.

17. The semiconductor light-emitting device according to claim 10, wherein more than one ridge portions are formed.

18. The semiconductor light-emitting device according to claim 17, wherein the ratio (D/L) of the width (D) of the protective film to the repetition width (L) of the ridge portions is from 0.001 to 0.25.

* * * * *